United States Patent [19]

Lin

[11] Patent Number: 6,033,589
[45] Date of Patent: Mar. 7, 2000

[54] METHOD FOR DEPOSITING A COATING LAYER ON A WAFER WITHOUT EDGE BEAD FORMATION

[75] Inventor: Hsiang-Lin Lin, Taipei, Taiwan

[73] Assignee: Taiwan Semiconductor Manufacturing Co., Ltd., Hsin-Chu, Taiwan

[21] Appl. No.: 08/941,713

[22] Filed: Sep. 30, 1997

[51] Int. Cl.[7] .................................................. C09D 5/20
[52] U.S. Cl. ............................ 216/92; 216/12; 216/106
[58] Field of Search ........................... 427/240; 118/320; 156/236; 216/12, 92, 106

[56] References Cited

U.S. PATENT DOCUMENTS 5,705,223  1/1998  Bunkofske ............................. 427/240

Primary Examiner—Bruce Breneman
Assistant Examiner—Alva C. Powell
Attorney, Agent, or Firm—Tung & Associates

[57] ABSTRACT

The present invention discloses a method for depositing a coating layer on an article without edge bead formation by integrating the steps of an edge bead rinsing process with a coating spin-out process such that an edge portion of the wafer can be efficiently cleaned with a cleaning solvent when the coating material is still in its liquid state. While the present invention method can be applied to any coating materials and to any coated substrate, it is particularly suitable for cleaning a spin-on-glass material from a semiconductor wafer such that the wafer edge is not coated with a SOG material and thus particulate contamination caused by cracked SOG from the wafer edge can be avoided.

21 Claims, 3 Drawing Sheets

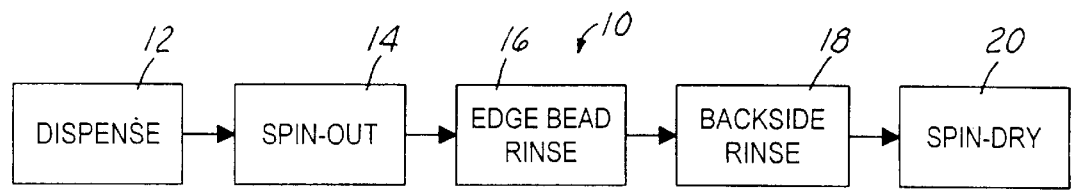
FIG. 1
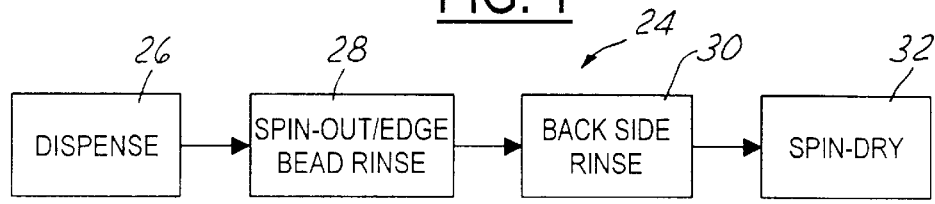
FIG. 2
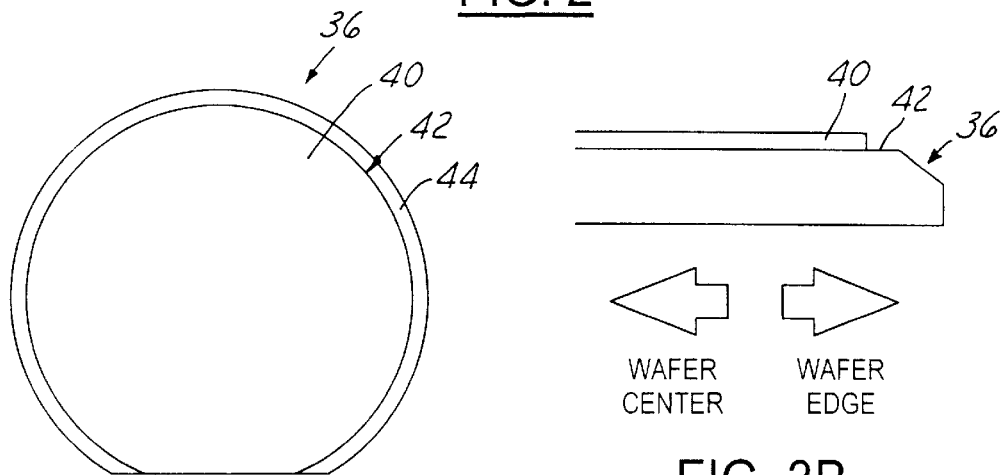
FIG. 3A
FIG. 3B
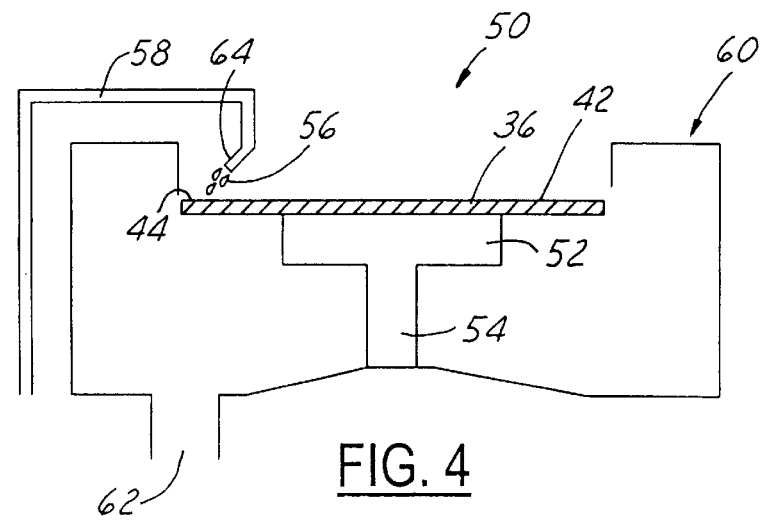
FIG. 4

METHOD FOR DEPOSITING A COATING LAYER ON A WAFER WITHOUT EDGE BEAD FORMATION

FIELD OF THE INVENTION

The present invention generally relates to a method for depositing a coating layer on a wafer without edge hump formation and more particularly, relates to a method for depositing a coating layer on a wafer by integrating an edge bead rinse step with a coating spin-out step such that edge hump formation can be completely avoided.

BACKGROUND OF THE INVENTION

In the fabrication of semiconductor devices, numerous processing steps must be performed on a semi-conducting wafer this is generally of a silicon nature. Among the numerous processing steps, a coating process wherein an insulating materials is coated on top of a wafer is frequently encountered. One of those frequently coated insulating materials is a material known as spin-on-glass (SOG).

SOG is frequently used for gap filling and planarization of inter-level-dielectrics (ILD) in multi-level metalization structures. It is a simple process and therefore is suitable for the low-cost fabrication of IC circuits. SOG materials that are commonly used can be categorized into two basic types, i.e., an inorganic type of silicate-based SOG and an organic type of siloxane-based SOG. A commonly used organic type SOG material is a silicon oxide based polysiloxane which is characterized with radical groups that replace or attach to the oxygen atoms. The basic structures, the molecular weight and the viscosity of SOG can be modified to produce SOG films of desirable properties for meeting specific requirements of certain IC fabrication process.

Typically, SOG can be applied to a pre-processed oxide surface as a liquid to fill gaps and steps on the substrate. Similar to the processing method for a liquid photoresist material, a SOG liquid can be dispensed onto a wafer and then spun-out at a predetermined rotational speed to achieve a specific thickness of the SOG layer. After the SOG liquid is evenly spun-out and applied to the surface of the substrate, it is cured at a temperature of approximately 400° C. and then etched back to obtain a smooth surface. A capping oxide layer can then be deposited onto the smooth SOG surface to prepare for the deposition of next inter-level metal layer. The etch-back process is carried out so that SOG is left between metal lines as insulators but not on top of the metal. The capping oxide layer is used to fill and protect SOG insulator during further fabrication processes. For siloxane-based SOG, it has been found that gaps as narrow as 0.15 μm can be satisfactorily filled. The siloxane-based SOG material therefore is suitable for 0.25 μm processing technology.

The silicate-based SOG material has properties similar to that of silicon dioxide when it is fully cured. The silicate-based SOG does not absorb water in any significant quantity and is thermally stable. One significant disadvantage of the silicate-based SOG material is its large volume shrinkage after curing which leads to high residual stress and tendency to crack during curing and further processing. The cracking of a SOG layer can cause serious contamination problems for the wafer fabrication process, even though the problem can sometimes be controlled by the application of only a very thin layer, i.e., as thin as 1,000 Å of the silicate-based SOG material.

In a conventional SOG coating process, a solvent edge bead rinse and a solvent backside rinse are normally incorporated into the process recipe for removing unwanted SOG deposited on the wafer edge and on the backside of the wafer. Either deposition is undesirable since they interfere with the operation of a wafer clamp which is frequently utilized in various process machines. The SOG material deposited on the wafer edge may crack under the clamp and creates a major contamination source. This is shown in FIG. 1. In a conventional SOG deposition process 10, as shown in FIG. 1, a SOG liquid material is first dispensed in step 12 by depositing a predetermined amount of liquid SOG at or near the center of the wafer. The amount of the SOG liquid can be suitably controlled by adjusting the flow rate through a dispensing nozzle from which the SOG is dispensed. The flow rate can, in turn, be controlled by a pressure existing in a liquid SOG reservoir tank.

The wafer turns on a wafer pedestal at a rotational speed between 2000 and 3000 RPM when liquid SOG material is dispensed at the center of the wafer. The liquid SOG material is therefore spun-out in step 14 by centrifugal forces from the center toward the edge of the wafer uniformly over the entire wafer surface. After all the liquid SOG material is spun-out and the edge of the wafer is fully covered, the solvent contained in liquid SOG has at least partially vaporized and formed a solid SOG coating on the wafer surface. After the spin-out step 14 is completed, an edge bead rinse process of step 16 is carried out at the edge of the wafer surface, i.e., an area of approximately 2~3 mm from the edge of the wafer, to wash away SOG deposited at such area. At this stage of the process, the SOG material has mostly solidified and thus the edge bead rinse process is not always effective. For instance, as shown in FIGS. 5A and 6A, the edge bead rinse process create a hump of SOG material (as indicated by the peaks in FIGS. 5A and 6A), since under an impinging jet of cleaning solvent, some of the SOG material is pushed back toward the center of the wafer even though the remaining SOG material is washed away. The amount of SOG that is pushed back toward the center of the wafer forms a hump or a new edge bead as indicated by peaks shown in FIGS. 5A and 6A. Residual processing stress left in the SOG layer after curing can cause cracks of the edge hump. The mechanical stress imposed on the edge bead by the application of a wafer clamp in a later fabrication step may also crack the hump and thus causing serious particulate contamination problems. After the edge bead rinse step 16, the backside of the wafer is rinsed by a different jet of cleaning solvent to wash away any SOG deposited at undesirable locations. This is shown as step 18 in FIG. 1. The wafer is then spun-dry in step 20 to complete the SOG coating process.

The conventional SOG coating process, shown in FIG. 1, presents serious problems in a wafer fabrication process due to the high likelihood for particulate contamination. The edge bead rinse process 16, while effective in eliminating SOG materials located in a narrow band along the edge of the wafer, creates problem of a new hump formation at the edge of the SOG layer on top of the silicon wafer.

It is therefore an object of the present invention to provide a method for depositing a coating layer on a wafer without edge hump formation that does not have the drawbacks or shortcomings of the conventional edge bead rinse process.

It is another object of the present invention to provide a method for depositing a coating layer on a wafer without edge hump formation that does not require major modifications in the process recipe.

It is a further object of the present invention to provide a method for depositing a coating layer on a wafer without edge hump formation by integrating an edge bead rinse step with a coating spin-out step.

It is another further object of the present invention to provide a method for depositing a spin-on-glass layer on a wafer without edge bead formation by carrying out a coating spin-out step simultaneously with an edge bead rinse step.

It is still another object of the present invention to provide a method for depositing a coating layer on a wafer without edge hump formation by rinsing away an edge portion of the coating material while the material is still in a liquid state during a coating spin-out process.

It is yet another object of the present invention to provide a method for cleaning a wafer edge and preventing edge bead formation by injecting a cleaning solvent at an edge portion of the wafer simultaneously during a coating spin-out process.

It is yet another further object of the present invention to provide a method for cleaning a wafer edge and preventing an edge hump formation during a wafer coating process by simultaneously washing the wafer edge with a cleaning solvent and spinning the wafer to spread out the coating material.

SUMMARY OF THE INVENTION

In accordance with the present invention, a method for depositing a coating layer on a wafer without edge hump formation which can be carried out by incorporating an edge bead rinse step with a coating spin-out step such that the coating layer at an edge portion of the wafer can be washed away when it is still in a liquid state is provided.

In a preferred embodiment, a method for depositing a coating layer on a wafer without the edge hump formation can be carried out by the operating steps of first positioning a wafer on a pedestal, then dispensing a predetermined amount of a coating material at or near the center of the wafer, then spinning the wafer at a predetermined rotational speed while substantially simultaneously injecting a cleaning solvent at an edge of the wafer flushing away said coating material at the edge portion, and then drying the coating material on the wafer.

In another preferred embodiment, a method for coating a wafer with a spin-on-glass layer without the edge bead formation problem can be carried out by the operating steps of first positioning a wafer on a pedestal, then dispensing a preset amount of spin-on-glass on the wafer at a proximity close to the center of the wafer, and then spinning the wafer to spread out the spin-on-glass to cover a top surface of the wafer and substantially simultaneously injecting a cleaning solvent at an edge of the wafer where an edge bead would otherwise form.

In still another preferred embodiment, a method for cleaning a wafer edge and preventing edge bead formation during a wafer coating process can be carried out by the operating steps of first providing a wafer situated on a pedestal, then depositing a liquid coating material on a top surface of the wafer, then rotating the wafer pedestal such that the liquid coating material spreads on the top surface of the wafer, and then injecting a cleaning solvent at an edge portion of the top surface of the wafer while the wafer is spinning and the coating material is substantially in its liquid state, thus flushing away the coating material from the edge portion of the wafer.

BRIEF DESCRIPTION OF THE DRAWINGS

These and other objects, features and advantages of the present invention will become apparent from the following detailed description and the appended drawings in which:

FIG. 1 is a process flow chart illustrating a conventional SOG coating process which includes a separate edge bead rinse.

FIG. 2 is a process flow chart illustrating a present invention method for depositing a coating layer without edge hump formation by integrating an edge bead rinse step with a liquid spin-out step.

FIG. 3A is a plane view of a wafer which has an edge bead removed by the present invention method.

FIG. 3B is an enlarged, partial cross-sectional view of the wafer of FIG. 3A with a SOG layer deposited on top and an edge bead removed.

FIG. 4 is a cross-sectional view for an apparatus utilized in carrying out the present invention novel method.

DETAILED DESCRIPTION OF THE PREFERRED EMBODIMENT

Figure 5A:
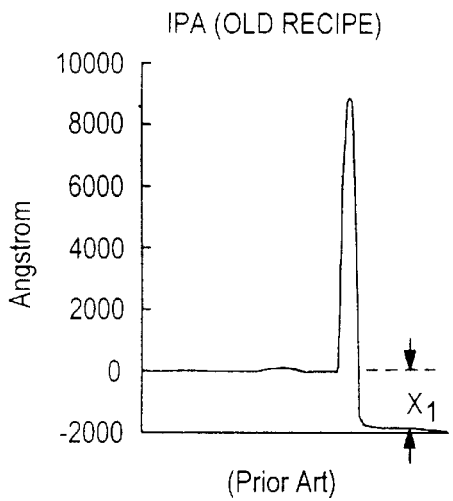
FIG. 5A is a profilometer trace made on a wafer surface processed by a conventional coating method utilizing IPA solvent.

The present invention discloses a method for depositing a coating layer on a wafer without the edge hump formation problem by integrating a solvent cleaning step with a coating spin-out step together such that coating material at the wafer edge can be effectively cleaned away while the material is still in its liquid state. The novel method of the present invention can be used for any coating process and, is particularly suitable for a spin-on-glass coating process conducted on a wafer.

Referring now to FIG. 2, wherein a process flow chart for the present invention novel process 24 is shown. The process 24 can be carried out first by a dispensing step 26 wherein a liquid coating material is deposited onto a wafer surface usually at a location near the center of the wafer. During the deposition process, the wafer is spun by a wafer pedestal onto which the wafer is positioned at a predetermined rotational speed. A suitable rotational speed can be chosen for different liquid materials and for materials having different viscosities. For instance, when a spin-on-glass material is dispensed onto a wafer surface, the rotational speed of the wafer can be suitably selected in a range between about 1000 RPM and about 5000 RPM, and preferably between about 2000 RPM and about 3000 RPM. The viscosity of the material is one of the factors that determine the rotational speed of the wafer. Other factors, such as the thickness of the final coating layer desired also determine the rotational speed of the wafer.

During the dispensing step 26 of the process, a liquid coating material is deposited onto a rotating wafer from a liquid dispensing nozzle in a predetermined amount. The amount of the liquid dispensed can be suitably controlled by the flow rate of the liquid through the dispensing nozzle and by the time period that the nozzle is allowed to open. The flow rate of the liquid material dispensed can, in turn, be controlled by a pressure applied in the liquid reservoir tank. For instance, a flow of nitrogen or other inert gas into the liquid reservoir tank facilitates the flow of liquid through the dispensing nozzle.

The present invention novel method of depositing a coating layer on a wafer without edge hump formation can be further executed in step 28 of the process. In this step, while the wafer is being spun on the wafer pedestal at a predetermined rotational speed, i.e., between about 1,000 RPM and about 5000 RPM, the liquid coating material dispensed at or near the center of the wafer is spun-out or spread out by centrifugal forces toward the edge of the wafer. For instance, in a SOG coating process, the time required for spinning the wafer such that a complete and uniform coverage of the SOG material on the wafer can be achieved is between about 10 seconds and about 20 seconds. The time required for the complete coverage of the wafer surface is obviously determined by the viscosity of the material dispensed thereon.

Instead of starting an edge bead rinse process (bead and hump are used interchangeably in the specification) after the SOG material has been completely spun-out, as that normally carried out in a conventional coating process, the present invention novel method integrates an edge bead rinse step with a coating spin-out step together and carries out the two steps simultaneously.

FIGS. 3A, 3B and 4 illustrate a plane view of a wafer, a partial cross-sectional view of a wafer and an apparatus used to carry out the present invention novel method. The present invention novel method achieves its greatly improved and unexpected results by injecting a jet of cleaning solvent at an edge area of the wafer to flush away liquid SOG material before it is solidified and therefore, preventing a push-back of the SOG particles and the formation of a new edge hump as that normally seen in the conventional edge bead rinsing process.

The cleaning solvents that can be utilized in the present invention novel method include $C_5H_{10}O_3$, $C_3H_8O$ or a mixture thereof. The $C_5H_{10}O_3$ cleaning solvent is commonly known in the semiconductor processing industry as EL-100, while the $C_3H_8O$ cleaning solvent is commonly known as IPA in the industry. Typical physical properties of EL-100 and IPA are illustrated in Table 1.

TABLE I

|  | EL-100 | IPA |
| --- | --- | --- |
| Molecular Formula | $C_5H_{10}O_3$ | $C_3H_8O$ |
| Flash Point (TCC) | 46° C. | 12° C. |
| Boiling Point | 154° C. | 82° C. |
| Specific Gravity | 1.03 at 20° C. | 0.785 at 20° C. |
| Evaporation Rate | 0.22 | 2.3 |
| Viscosity (cps) | 2.51 | 3.98 |
| Vapor Pressure | 2.8 mmHg at 20° C. | 2.07 mmHg at 20° C. |

It should be noted that while EL-100 and IPA solvents are given as examples in the present invention novel method, the method is not limited to the application of these two solvents. Any other chemical solvents may be suitably used as long as a coating bead of SOG, photoresist, oxide or any other materials can be efficiently washed away in a reasonable amount of time when injected upon by such solvent.

After the combined spin-out/edge bead rinse step 28 is completed, the wafer is sent through a backside rinse cycle 30 during which the backside of the wafer is rinsed with a cleaning solvent to remove any undesirable coating material. The wafer is then sent through a spin dry process 32 to dry off all the cleaning solvent on its surfaces.

FIG. 3A shows a plane view of a wafer 36 that has been processed by the present invention method. The wafer 36 has a flat edge 38 to facilitate the registration in a process machine. During a SOG coating process, SOG layer 40 is blanket deposited on the top surface 42 of the wafer. The SOG layer is frequently used as a dielectric layer for insulating metal lines. Since a wafer may be processed in many subsequent procesing steps during which the wafer must be positioned in various reaction chambers. In some of the reaction chambers, the wafer is positioned on a platform and held down on the edge by a wafer clamp. The function of the wafer clamp is to prevent the wafer from moving during the process when reaction gases or etchant gases may be flowing into the reaction chamber and thus causing a turbulent. In order to ensure the wafer clamp to function properly in those subsequent processing steps, the edge portion 44 of the wafer must be cleaned such that no coating material remains. The edge portion 44 normally extends from the outer edge of the wafer inwardly toward the center to approximately between 2 and 4 mm. An enlarged, partial cross-sectional view of the wafer 36 is shown in FIG. 3B.

The present invention novel method of depositing a coating layer on a wafer without the edge hump formation can be carried out in an apparatus similar to that shown in FIG. 4. In apparatus 50, wafer 36 is positioned horizontally on top of a wafer pedestal 52 which is rotated by shaft 54 at a desirable rotational speed. It has been found that for a SOG material, a suitable rotational speed may be chosen between about 1000 RPM and about 5000 RPM, and preferable between about 2000 RPM and about 3000 RPM. The shaft 54 is driven by a motor (not shown). The wafer 36, the wafer pedestal 52, and the shaft 54 are contained in a liquid collection tank 60 capable of recycling used cleaning solvent through outlet 62. A cleaning solvent 56 of either EL-100 or IPA is delivered by a fluid passage 58 and a fluid injector 64.

Cleaning solvent is fed from a reservoir (not shown) through passage 58, nozzle 64 to impinge upon the edge portion 44 of the wafer 36. By using the present invention novel method during which a solvent cleaning process starts at or about the same time when the wafer 36 starts to spread out of the coating material deposited on top, the edge portion 44 remains coating free since liquid coating materials spun out from the center of the wafer is flushed away. It has been noted that for the present invention method to function properly, a small distance should be kept between the tip of the injector nozzle 64 and the wafer surface 42. For instance, in a SOG coating process, a suitable distance between the tip of the injecting nozzle 64 and the wafer top surface 42 should be to between about 2 mm and about 8 mm, and preferably between about 3 mm and about 5 mm.

The time period during which the cleaning solvent is injected at edge 44 of the wafer 36 from injector nozzle 64 can be suitably chosen of any time period that is not less than about 2 seconds. For instance, a time period between about 3 and about 10 seconds may be adequate depending on the amount of time required for the coating material to spread out to reach the edge portion 44 of the wafer. The cleaning solvent can be injected from the injector nozzle 64 at a flow rate between about 20 sccmn and about 200 sccm, preferably between about 50 sccm and about 120 sccm.

Figure 5B:
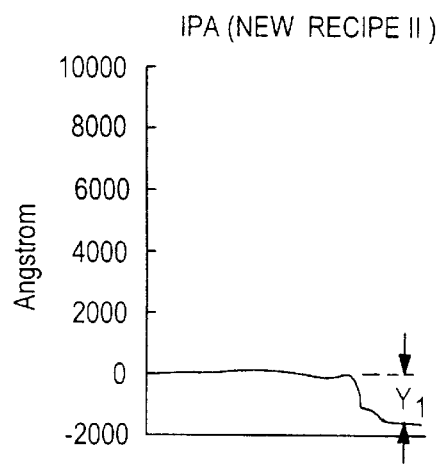
FIG. 5B is a profilometer trace made on a wafer surface processed by the present invention coating method utilizing EL-100 solvent.
Figure 6A:
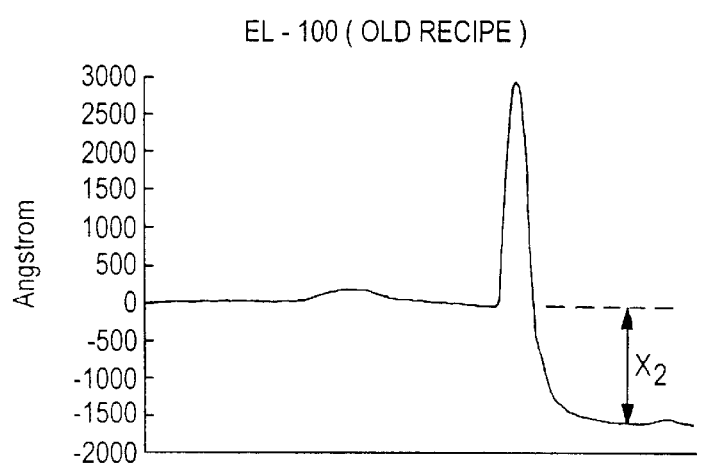
FIG. 6A is a profilometer trace made on a wafer surface processed by a conventional coating method utilizing EL-100 solvent.
Figure 6B:
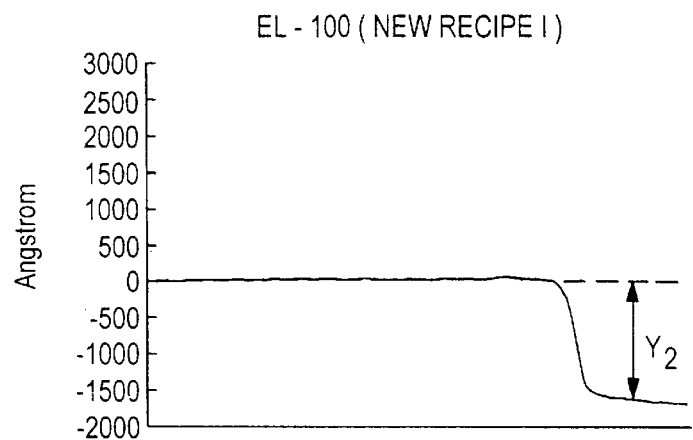
FIG. 6B is a profilometer trace made on a wafer surface processed by the present invention coating method utilizing EL-100 solvent.
Figure 7:
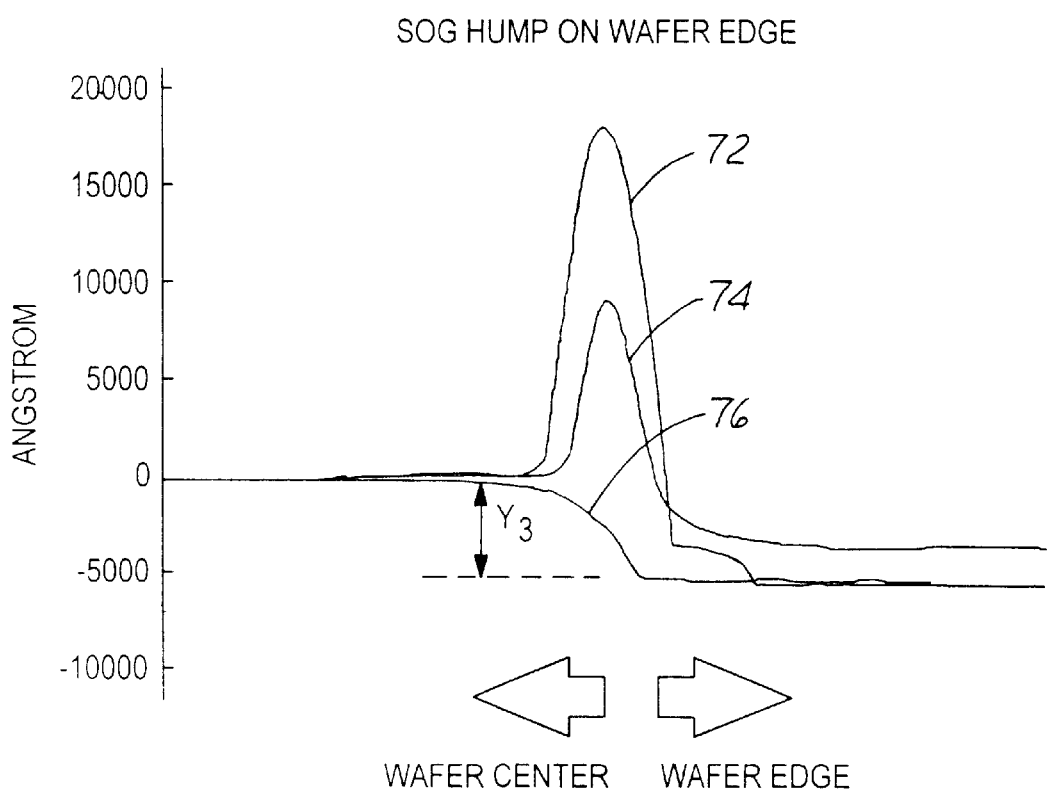
FIG. 7 are profilometer traces illustrating profiles obtained on surfaces of wafers processed by a conventional coating method and by the present invention coating method plotted together for comparison.

The desirable effect of the present invention novel method is shown in FIGS. 5B, 6B and 7.

EXAMPLE I

In this Example, a SOG coating process is carried out in combination with a solvent cleaning process by using a solvent of IPA. FIG. 5B is a profilometer trace illustrating the effect of the present invention novel method which can be compared to the result obtained from a conventional cleaning method shown in FIG. 5A. In the result obtained from the conventional method, the coating material was first spun-out to completely cover the wafer surface and then, an edge bead rinse process is implemented for removing an edge bead formed on the wafer. As shown in FIG. 5A, even though the edge bead at the very edge of the wafer was removed, as indicated by $X_1$ (of approximately 2000 Å) indicating a drop between the surface of the SOG coating and the surface of the wafer, a peak of approximately 9000 Å indicates a new bead of SOG is formed by the cleaning process itself where the edge bead material is pushed back by the cleaning solvent toward the center of the wafer.

When the present invention method is executed, as indicated by the profilometer trace shown in FIG. 5B, the 9000 Å peak shown in FIG. 5A has completely disappeared leaving only a drop of $Y_1$ of approximately 1800 Å. This indicates that the edge bead of SOG (i.e., $Y_1$) was completely removed by the cleaning solvent without forming a new bead as seen in the conventional cleaning method.

EXAMPLE II

In this Example, a cleaning solvent of EL-100 is used to clean the edge bead. FIG. 6A shows, for comparison, the result obtained from a conventional cleaning method for a wafer edge bead by a solvent of EL-100. It is seen that even though the bead at the wafer edge, i.e., indicated by $X_2$, has been flushed away, a new edge bead of approximately 3000 Å has been formed. When compared to FIG. 6B, in which the present invention method is executed with EL-100 cleaning solvent, the 3000 Å peak has completed disappeared leaving an area on the wafer edge (indicated by $Y_2$) without bead formation.

It should be noted that data in FIGS. 5A, 5B, 6A and 6B were obtained on wafer surfaces that have been applied with a single coat of SOG material.

EXAMPLE III

In this Example, simulating a production process, three layers of SOG coating were applied on a wafer surface by using both a conventional cleaning method and the present invention cleaning method. For instance, curve 72 indicates data obtained on a wafer surface cleaned by a conventional cleaning method utilizing IPA, curve 74 indicates data obtained on a wafer surface cleaned by a conventional method utilizing EL-100, and curve 76 indicates data obtained on a wafer surface coated with SOG and cleaned by the present invention cleaning method utilizing either EL-100 or IPA. The top surface on the SOG coating layer is used as a reference surface, (i.e., as 0 Å) on the vertical axis. It is seen that, with three layers of SOG coatings simulating that normally used in a fabrication process, the conventional method produces curves 72 and 74 each having a peak at 18,000 Å and at 9,000 Å, respectively evidencing the formation of new edge beads after the conventional solvent cleaning process. On the contrary, curve 76 obtained on data cleaned by the present invention method does not show any new bead formation except a thorough cleaning of the SOG layer of approximately 5,000 Å thick as indicated by $Y_3$ in FIG. 7. The data contained in FIG. 7 simulate that of a production wafer having three layers of SOG material coated thereon.

The present invention method greatly improves, i.e., by an average yield increase of 3%, the fabrication process for SOG coating. This is shown by data in Table II. It should be noted that the standard deviation is also improved indicating an improvement in wafer quality.

TABLE II

|       | Conventional Cleaning | | Present Invention Cleaning | |
|-------|------|------|------|------|
|       | Yield | S/D | Yield | S/D |
| Lot A | 95.53 | 1.23 | 96.0  | 0.94 |
| Lot B | 87.34 | 5.43 | 90.37 | 1.55 |
| Lot C | 79.16 | 7.5  | 84.17 | 6.48 |
| Lot D | 85.34 | 5.56 | 86.50 | 3.28 |

The present invention novel method has therefore been amply demonstrated by the above descriptions and the appended drawings. It has been shown that a coating layer can be deposited on a wafer surface without edge bead formation by integrating a cleaning process with a coating spin-out process to greatly improve the cleaning efficacy. It should be noted that while a coating layer of SOG has been used to demonstrate the present invention novel method, the process can be carried out on any coating material and on any substrate as long as a naked edge portion of a substrate without coating is desired. The coating material is therefore not limited to a SOG material and that the coated substrate is not limited to a semiconductor wafer.

While the present invention has been described in an illustrative manner, it should be understood that the terminology used is intended to be in a nature of words of description rather than of limitation.

Furthermore, while the present invention has been described in terms of the preferred embodiments, it is to be appreciated that those skilled in the art will readily apply these teachings to other possible variations of the invention.

The embodiment of the invention in which an exclusive property or privilege is claimed are defined in the following claims:

1. A method for depositing a liquid coating layer on a top surface of a wafer without edge hump formation comprising the steps of:

positioning a wafer on a pedestal, dispensing an amount of a liquid coating material at or near the center of said top surface of the wafer, spinning the wafer at a rotational speed for spreading the liquid coating material while simultaneously injecting a cleaning solvent at an edge of said top surface of the wafer flushing away coating material, and drying said liquid coating material on the wafer.

2. A method according to claim 1, wherein said coating layer is a spin-on-glass layer.

3. A method according to claim 1, wherein cleaning solvent is injected at a flow rate between about 20 sccm and about 200 sccm.

4. A method according to claim 1, wherein said rotational speed for said wafer is between about 1000 RPM and about 5000 RPM.

5. A method according to claim 1, wherein said cleaning solvent is injected at the edge of the wafer from an injector at a distance from said wafer between about 2 mm and about 8 mm.

6. A method according to claim 1, wherein said cleaning solvent is injected at the edge of the wafer from an injector at a close proximity to a top surface of the wafer.

7. A method according to claim 1, wherein said cleaning solvent is selected from the group consisting of $C_5H_{10}O_3$ and $C_3H_8O$.

8. A method according to claim 1, wherein said cleaning solvent is injected at the edge of the wafer from an injector for a period of time of not less than 2 seconds.

9. A method for coating a top surface of a wafer with a spin-on-glass layer without edge bead formation comprising the steps of:

positioning a wafer on a pedestal, dispensing a preset amount of spin-on-glass liquid on said top surface of said wafer at a close proximity to the center of the wafer, and spinning the wafer to spread out the spin-on-glass liquid to substantially cover said top surface of the wafer and substantially simultaneously injecting a cleaning solvent at an edge of said top surface of the wafer.

10. A method according to claim 9 further comprising the step of drying said spin-on-glass liquid on said wafer forming a spin-on-glass coating.

11. A method according to claim 9 further comprising the step of spinning said wafer at a preset speed of between about 1000 RPM and about 5000 RPM.

12. A method according to claim 9, wherein said cleaning solvent is injected at a flow rate between about 20 sccm and about 200 sccm.

13. A method according to claim 9, wherein said cleaning solvent is injected from an injector positioned juxtaposed to a top surface of said wafer.

14. A method according to claim 9, wherein said cleaning solvent is injected from an injector positioned at a distance of not more than 8 mm from a top surface of the wafer.

15. A method according to claim 9, wherein said cleaning solvent is selected from the group consisting of $C_5H_{10}O_3$ and $C_3H_8O$.

16. A method for cleaning a wafer edge and preventing edge bead formation during a wafer coating process comprising the steps of:

providing a wafer situated on a pedestal, depositing a liquid coating material on a top surface of the wafer, rotating the wafer pedestal such that said liquid coating material spread on the top surface of the wafer, and injecting a cleaning solvent at an edge portion of the top surface of the wafer while the wafer is rotating and while the coating material is substantially in its liquid state, such that the coating material at the edge portion of the wafer is flushed away.

17. A method according to claim 16, wherein said liquid coating material is a spin-on-glass.

18. A method according to claim 16, wherein said cleaning solvent is injected from an injector positioned immediately adjacent to said top surface of said wafer.

19. A method according to claim 16, wherein said cleaning solvent is injected at a flow rate between about 20 sccm and about 200 sccm for a time period of not less than 2 seconds.

20. A method according to claim 16, wherein said cleaning solvent is a solvent for spin-on-glass materials.

21. A method according to claim 16, wherein said pedestal is rotated at a speed between about 1000 RPM and about 5000 RPM.

* * * * *